(12) United States Patent
Oku (10) Patent No.: US 9,509,259 B2
(45) Date of Patent: Nov. 29, 2016

(54) AMPLIFIER

(71) Applicant: FUJITSU LIMITED, Kawasaki-shi, Kanagawa (JP)

(72) Inventor: Hideki Oku, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/969,063

(22) Filed: Dec. 15, 2015

(65) Prior Publication Data

US 2016/0197585 A1 Jul. 7, 2016

(30) Foreign Application Priority Data

Jan. 6, 2015 (JP) .................................. 2015-001094

(51) Int. Cl.
*H03F 3/04* (2006.01)
*H03F 3/08* (2006.01)
*H03F 3/50* (2006.01)
*H03F 3/45* (2006.01)

(52) U.S. Cl.
CPC ............ *H03F 3/08* (2013.01); *H03F 3/45103* (2013.01); *H03F 3/50* (2013.01); *H03F 2203/45601* (2013.01); *H03F 2203/45612* (2013.01); *H03F 2203/45668* (2013.01)

(58) Field of Classification Search
CPC ........................................................ H03F 3/04
USPC ........................................ 330/311, 252, 253
See application file for complete search history.

(56) References Cited

U.S. PATENT DOCUMENTS

| | | | | |
|---|---|---|---|---|
| 3,870,968 A | * | 3/1975 | Vosteen | H03F 3/45479 330/253 |
| 5,825,231 A | * | 10/1998 | Chevallier | H03D 7/1433 327/356 |
| 2004/0119537 A1 | * | 6/2004 | Jaussi | H03F 3/45183 330/257 |
| 2007/0018725 A1 | * | 1/2007 | Morikawa | H03F 3/45197 330/253 |
| 2009/0102552 A1 | | 4/2009 | Shiramizu et al. | |
| 2010/0090765 A1 | * | 4/2010 | Hurwitz | H03G 3/001 330/254 |
| 2010/0116969 A1 | | 5/2010 | Suzuki | |
| 2011/0316632 A1 | | 12/2011 | Takemoto et al. | |
| 2012/0086509 A1 | * | 4/2012 | Snoeij | H03F 3/45112 330/257 |
| 2012/0121273 A1 | * | 5/2012 | Ito | H03F 3/087 398/202 |
| 2014/0171005 A1 | * | 6/2014 | Mikhemar | H04B 1/18 455/293 |

FOREIGN PATENT DOCUMENTS

| | | |
|---|---|---|
| JP | 11-205047 | 7/1999 |
| JP | 2005-210147 | 8/2005 |
| JP | 2009-100337 | 5/2009 |
| WO | 2008/120663 | 10/2008 |
| WO | 2010/100741 | 9/2010 |

OTHER PUBLICATIONS

S. Mohan et. al, "Bandwidth Extension in CMOS with Optimized On-Chip Inductors", IEEE Journal of Solid-State Circuits, vol. 35, No. 3, pp. 346-355, Mar. 2000 (10 pages).

* cited by examiner

*Primary Examiner* — Patricia T Nguyen
(74) *Attorney, Agent, or Firm* — Fujitsu Patent Center (57) ABSTRACT

An amplifier 12 including a first transistor 23 which is a common base transistor and whose emitter current fluctuates in accordance with fluctuations in an input current that is input to the emitter, a second transistor 24 which is a common base transistor, whose emitter is connected to the collector of the first transistor 23, and whose collector voltage fluctuates in accordance with fluctuations in the emitter current of the first transistor 23, a third transistor 31 which is a common collector transistor and whose base is connected to the collector of the second transistor 24, and an amplification unit 40 to which an emitter voltage of the third transistor 3 is input and which outputs an amplified voltage obtained by amplifying the emitter voltage of the third transistor, wherein the base resistance of the second transistor 24 is higher than the base resistance of the first transistor 23.

6 Claims, 8 Drawing Sheets

AMPLIFIER

CROSS-REFERENCE TO RELATED APPLICATION

This application is based upon and claims the benefit of priority of the prior Japanese Patent Application No. 2015-1094, filed on Jan. 6, 2015, the entire contents of which are incorporated herein by reference.

FIELD

The present invention relates to an amplifier.

BACKGROUND

An amplifier, also referred to as a trans impedance amplifier (TIA) circuit, is known, which converts an electric signal converted from an optical signal by a photodetector, such as a photodiode, into a voltage signal and amplifies the signal. For example, an amplifier is known, which converts a current signal converted from an optical signal into a voltage signal by using a common base or common gate transistor (e.g., see Patent Documents 1 to 3 and Non-Patent Document 1). Further, a differential amplifier is known, which takes a current signal converted from an optical signal to be one of input signals (e.g., see Patent Documents 4 and 5).

RELATED DOCUMENTS

[Patent Document 1] International Publication Pamphlet No. WO 2010/100741
[Patent Document 1] Japanese Laid Open Patent Document No. 2009-100337
[Patent Document 1] Japanese Laid Open Patent Document No. 11-205047
[Patent Document 1] Japanese Laid Open Patent Document No. 2005-210147
[Patent Document 1] International Publication Pamphlet No. WO 2008/120663
[Non-Patent Document 1] "Bandwidth Extension in CMOS with Optimized On-Chip Inductors", S. Mohan, et. al, IEEE JOURNAL OF SOLID-STATE CIRCUITS, VOL. 35, NO. 3, pp. 346-355, MARCH, 2000

SUMMARY

In one aspect, an amplifier has a first transistor, a second transistor, a third transistor, and an amplification unit. The first transistor is a common base transistor and the emitter current fluctuates in accordance with the fluctuations in the input current that is input to the emitter. The second transistor is a common base transistor, the emitter is connected to the collector of the first transistor, and the collector voltage fluctuates in accordance with the fluctuations in the emitter current of the first transistor. The third transistor is a common collector transistor and the base is connected to the collector of the second transistor. The amplification unit outputs an amplified voltage obtained by amplifying the emitter voltage of the third transistor. The base resistance of the second transistor is higher than the base resistance of the first transistor.

The object and advantages of the embodiments will be realized and attained by means of the elements and combination particularly pointed out in the claims.

It is to be understood that both the foregoing general description and the following detailed description are exemplary and explanatory and are not restrictive of the invention.

DESCRIPTION OF EMBODIMENTS

Hereinafter, with reference to the drawings, an amplifier will be explained. However, it should be noted that the technical scope of the present invention is not limited to those embodiments, however encompasses the inventions described in the claims and equivalents thereof.

(Outline of Amplifier According to Embodiment)
If an amplifier that converts a current signal converted from an optical signal into a voltage signal by using a common base or common gate transistor and amplifies the signal is configured so as to be capable of a high-speed operation, noise may be superimposed on the electric current converted from the optical signal.

The amplifier according to the embodiment has a common base circuit that is cascade-connected so that a current signal is input to the emitter of a transistor whose base resistance is low, and an emitter follower circuit arranged between the common base circuit and the amplification unit. Thus, in the amplifier according to the embodiment, noise in the amplifier may be reduced by reducing input referred noise of the common base circuit and by cutting off the noise of the amplification unit by using the emitter follower circuit, and the speed of the amplifier may be increased by reducing the parasitic capacitance of the common base circuit and by increasing the cutoff frequency.

Figure 1:
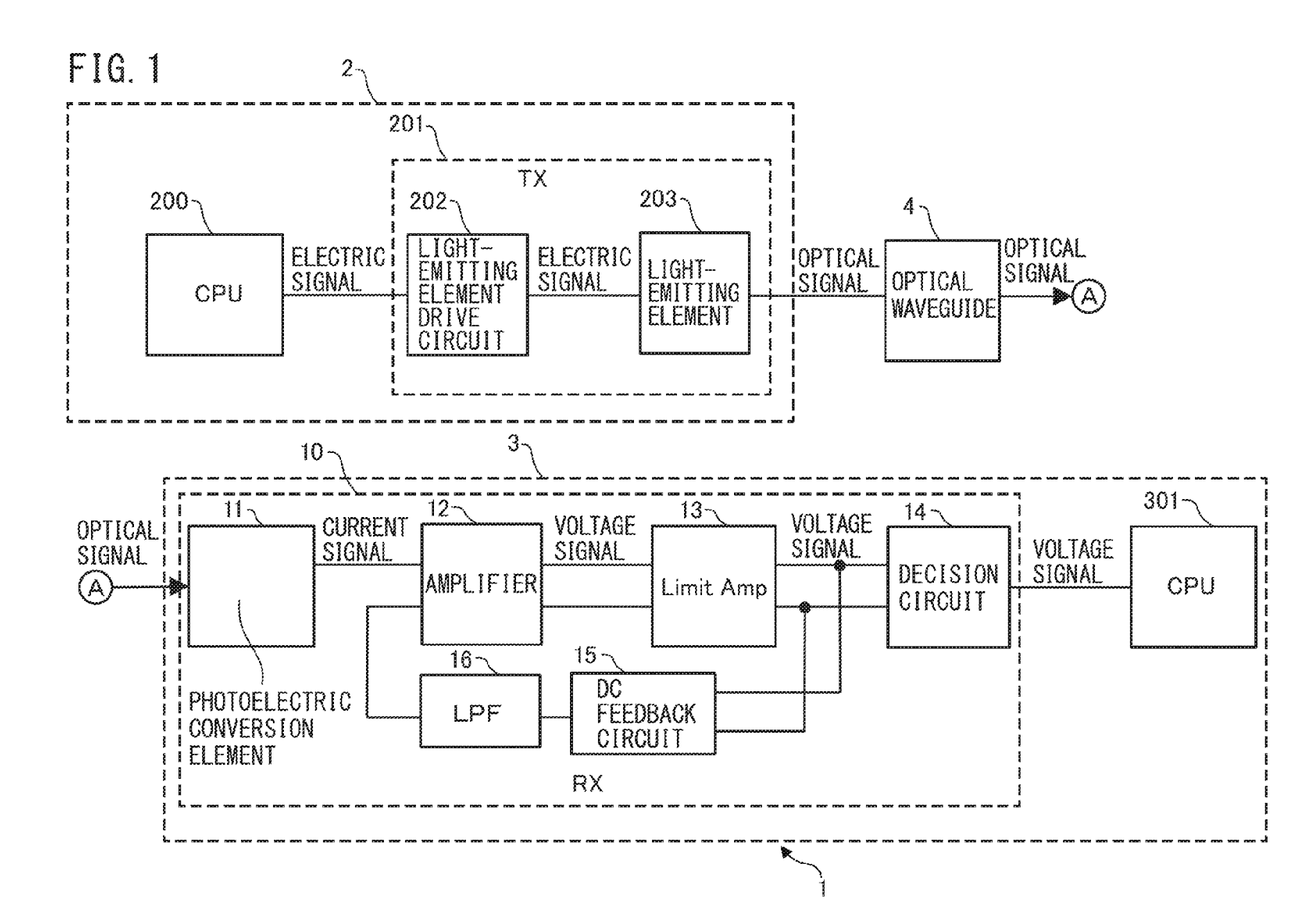
FIG. 1 is a circuit block diagram of a communication system according to an embodiment.

(Communication System According to Embodiment)
FIG. 1 is a circuit block diagram of a communication system according to the embodiment.
A communication system 1 has a transmission device 2, a reception device 3, and an optical waveguide 4 through which an optical signal is transmitted between the transmission device 2 and the reception device 3.

The transmission device 2 has a calculation device 200 and a transmitter 201. The transmitter 201 has a light-emitting element drive circuit 202 and a light-emitting element 203. The calculation device 200 is a CPU, and generates an electric signal that is transmitted to the reception device 3 and outputs the electric signal to the light-emitting element drive circuit 202. The light-emitting element drive circuit 202 generates an electric signal generated by the calculation device 200 which may be converted into an optical signal by the light-emitting element 203, and outputs the electric signal to the light-emitting element 203. The light-emitting element 203 generates an optical signal in accordance with the electric signal that is input from the light-emitting element drive circuit 202 and outputs the optical signal to the reception device 3 via the optical waveguide 4.

The reception device 3 has a receiver 10 and a calculation device 300, which is a CPU. The receiver 10 has a photoelectric conversion element 11, which is a photodiode, an amplifier 12, a limiting amplifier 13, a decision circuit 14, a DC feedback circuit 15, and a low-pass filter 16. The photoelectric conversion element 11 generates a current signal in accordance with the optical signal that is input from the transmission device 2 via the optical waveguide 4 and outputs the current signal to the amplifier 12. The amplifier 12 is a differential amplifier that amplifies the current signal that is input from the photoelectric conversion element 11 and converts the current signal into a voltage signal by using the current signal that is input from the low-pass filter 16, and outputs the voltage signal to the limiting amplifier 13. The limiting amplifier 13 shapes the voltage signal by adjusting the frequency characteristics of the voltage signal that is input from the amplifier 12 and outputs the voltage signal to the decision circuit 14. The decision circuit 14 decides information included in the voltage signal that is input from the limiting amplifier 13 and outputs an electric signal corresponding to the discriminated information to the calculation device 300. The DC feedback circuit 15 amplifies the amplitude of the voltage signal that is input from the limiting amplifier 13 so that the amplitude of the current signal that is fed back to the amplifier 12 comes to have a desired magnitude, and outputs the voltage signal to the low-pass filter 16. The low-pass filter 16 outputs a current signal, which is obtained by averaging the signals that are input from the DC feedback circuit 15, to the amplifier 12.

(Configuration and Function of Amplifier According to Embodiment)

Figure 2:
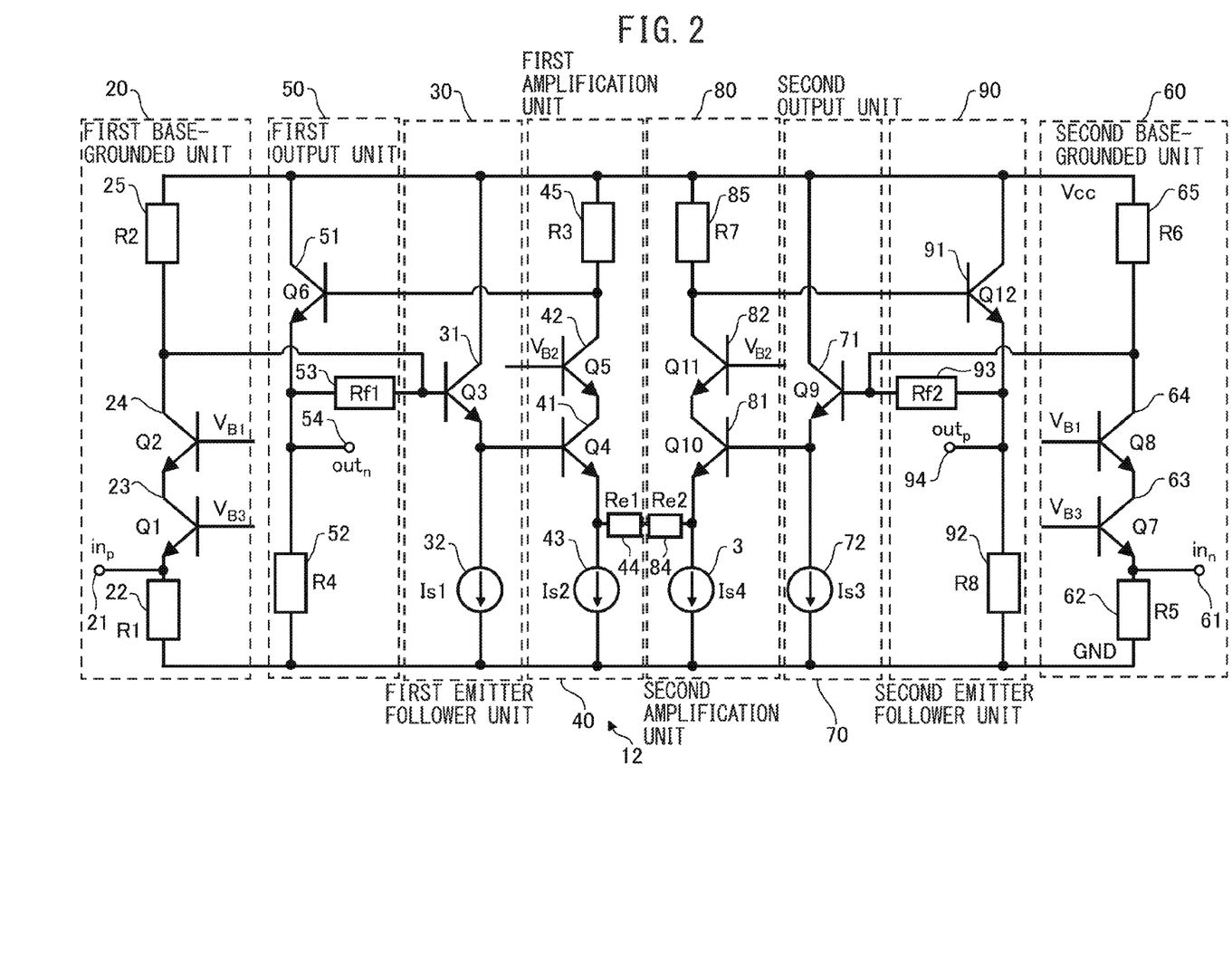
FIG. 2 is an internal circuit block diagram of the amplifier illustrated in FIG. 1.

FIG. 2 is an internal circuit block diagram of the amplifier 12.

The amplifier 12 has a first common base unit 20, a first emitter follower unit 30, a first amplification unit 40, a first output unit 50, a second common base unit 60, a second emitter follower unit 70, a second amplification unit 80, and a second output unit 90.

The first common base unit 20 has a first input terminal 21, a first resistance element 22, a first transistor 23, a second transistor 24, and a second resistance element 25. The first input terminal 21 supplies an input current, which is the current signal that is input from the photoelectric conversion element 11, to one end of the first resistance element 22 and to the emitter of the first transistor. The other end of the first resistance element 22 is grounded and the input current that is input from the photoelectric conversion element 11 and the emitter current of the first transistor flow through the first resistance element 22. Each of the first transistor 23 and the second transistor 24 is a common base npn transistor. The first transistor 23 and the second transistor 24 are cascade-connected, by connecting the emitter of the first transistor 23 to the first input terminal 21 and connecting the collector of the first transistor 23 to the emitter of the second transistor 24. The transistor size of the first transistor 23 is larger than the transistor size of the second transistor 24. In other words, the base resistance of the first transistor 23 is lower than the base resistance of the second transistor 24. One end of the second resistance element 25 is connected to the collector of the second transistor 24 and the other end is connected to a power source voltage Vcc.

In the first common base unit 20, the collector voltage of the second transistor 24 fluctuates in accordance with whether the input current is input from the photoelectric conversion element 11 or not. Since the first transistor 23 is a common base transistor, the emitter voltage of the first transistor 23 has a constant value whether the input current is input from the photoelectric conversion element 11 or not. When the input current is input from the photoelectric conversion element 11, the total current of the input current and the emitter current of the first transistor 23 flows through the first resistance element 22. Since the emitter voltage of the first transistor 23 has a constant value, the amount of the emitter current when the input current is input from the photoelectric conversion element 11 is reduced compared to that when the input current is not input. As the amount of the emitter current of the first transistor 23 is reduced, the amount of the collector current of the second transistor 24 is reduced. When the amount of the collector current of the second transistor 24 is reduced, the amount of voltage drop due to the second resistance element 25 becomes small, and therefore the collector voltage of the second transistor 24 increases. As described above, the collector voltage of the second transistor 24 increases when the input current is input from the photoelectric conversion element 11 compared to that when the input current is not input from the photoelectric conversion element 11.

The first emitter follower unit 30 has a third transistor 31 and a first current source 32. The third transistor 31 is a common collector npn transistor, i.e., an emitter follower circuit. The base of the third transistor 31 is connected to the collector of the second transistor 24, the emitter is connected to the first current source 32, and the collector is connected to the power source voltage Vcc. On end of the first current source 32 is connected to the emitter of the third transistor 31 and the other end is grounded.

In the first emitter follower unit 30, the emitter voltage of the third transistor 31 fluctuates in accordance with the fluctuations in the collector voltage of the second transistor 24, since the emitter voltage of the third transistor 31 fluctuates following the fluctuations in the base voltage of the third transistor 31, which is the same potential as the collector voltage of the second transistor 24. In the first emitter follower unit 30, when the input current is input from the photoelectric conversion element 11, the emitter voltage of the third transistor 31 increases following that the collector voltage of the second transistor 24 and the base voltage of the third transistor increase.

The first amplification unit 40 has a fourth transistor 41, a fifth transistor 42, a second current source 43, a first connection resistance element 44, and a third resistance element 45. Each of the fourth transistor 41 and the fifth transistor 42 is an npn transistor and the fourth transistor 41 is a common emitter transistor and the fifth transistor 42 is a common base transistor, and thereby cascode connection is attained. One end of the second current source 43 is connected to the emitter of the fourth transistor 41 and the other end is grounded. One end of the first connection resistance element 44 is connected to the emitter of the fourth transistor 41 and the other end is connected to the second output unit 90. One end of the third resistance element 45 is connected to the collector of the fifth transistor 42 and the other end is connected to the power source voltage Vcc.

The first amplification unit 40 inverts and amplifies the fluctuations in the base voltage of the fourth transistor 41 and outputs the inverted and amplified fluctuations to a first output terminal. When the base voltage of the fourth transistor 41 fluctuates, the emitter voltage of the fourth transistor 41 fluctuates following the fluctuations in the base voltage of the fourth transistor 41. When the emitter voltage of the fourth transistor 41 fluctuates, the emitter current of the fourth transistor 41 fluctuates following the fluctuations in the base voltage of the fourth transistor 41. For example, when the emitter voltage of the fourth transistor 41 increases, the emitter current of the fourth transistor 41 increases in amount, since when the emitter voltage of the fourth transistor 41 increases, the emitter current of the fourth transistor 41 becomes the sum of the constant current that flows through the second current source 43 and the current that flows through the second output unit 90 via the first connection resistance element 44. When the emitter voltage of the fourth transistor 41 drops, the emitter current of the fourth transistor 41 is reduced in amount, since when the emitter voltage of the fourth transistor 41 drops, the emitter current of the fourth transistor 41 becomes a current that is obtained by subtracting the current that flows from the second output unit 90 via the first connection resistance element 44 from the constant current that flows through the second current source 43. When the emitter voltage of the fourth transistor 41 fluctuates, the collector voltage of the fifth transistor 42 fluctuates in accordance with the voltage that is obtained by inverting and amplifying the fluctuations in the emitter voltage of the fourth transistor 41, since the amount of voltage drop due to the third resistance element 45 fluctuates when the emitter current of the fourth transistor 41 fluctuates in accordance with the fluctuations in the emitter voltage of the fourth transistor 41. The collector voltage of the fifth transistor 42 drops when the emitter voltage of the fourth transistor 41 increases and the collector voltage of the fifth transistor 42 increases when the emitter voltage of the fourth transistor 41 drops.

The first output unit 50 has a sixth transistor 51, a fourth resistance element 52, a first feedback resistance element 53, and a first output terminal 54. The sixth transistor 51 is a common collector npn transistor. One end of the fourth resistance element 52 is connected to the emitter of the sixth transistor 51 and the other end is grounded. One end of the first feedback resistance element 53 is connected to the emitter of the sixth transistor 51 and the other end is connected to the base of the third transistor 31. The first output terminal 54 supplies the emitter voltage of the sixth transistor 51 to the input terminal of the limiting amplifier 13.

The voltage of the first output terminal 54 fluctuates following the base voltage of the sixth transistor 51 connected to the collector voltage of the fifth transistor 42, and therefore the voltage of the first output terminal 54 fluctuates in accordance with the value that is obtained by inverting and amplifying the fluctuations in the base voltage of the fourth transistor 41.

The second common base unit 60 has a second input terminal 61, a fifth resistance element 62, a seventh transistor 63, an eighth transistor 64, and a sixth resistance element 65. The configuration and function of the second common base unit 60 are the same as those of the first common base unit 20 except in that the current signal averaged by the low-pass filter 16 is input to the second input terminal 61, and therefore detailed explanation is omitted.

The second emitter follower unit 70 has a ninth transistor 71 and a third current source 72. The configuration and function of the second emitter follower unit 70 are the same as those of the first emitter follower unit 30, and therefore detailed explanation is omitted.

The second amplification unit 80 has a tenth transistor 81, an eleventh transistor 82, a fourth current source 83, a second connection resistance element 84, and a seventh resistance element 85. The configuration and function of the second amplification unit 80 are the same as those of the first amplification unit 40, and therefore detailed explanation is omitted.

The second output unit 90 has a twelfth transistor 91, an eighth resistance element 92, a second feedback resistance element 93, and a second output terminal 94. The configuration and function of the second output unit 90 are the same as those of the first output unit 50, and therefore a detailed explanation is omitted.

(Noise Characteristics of an Amplifier According to Embodiment)

Figure 3:
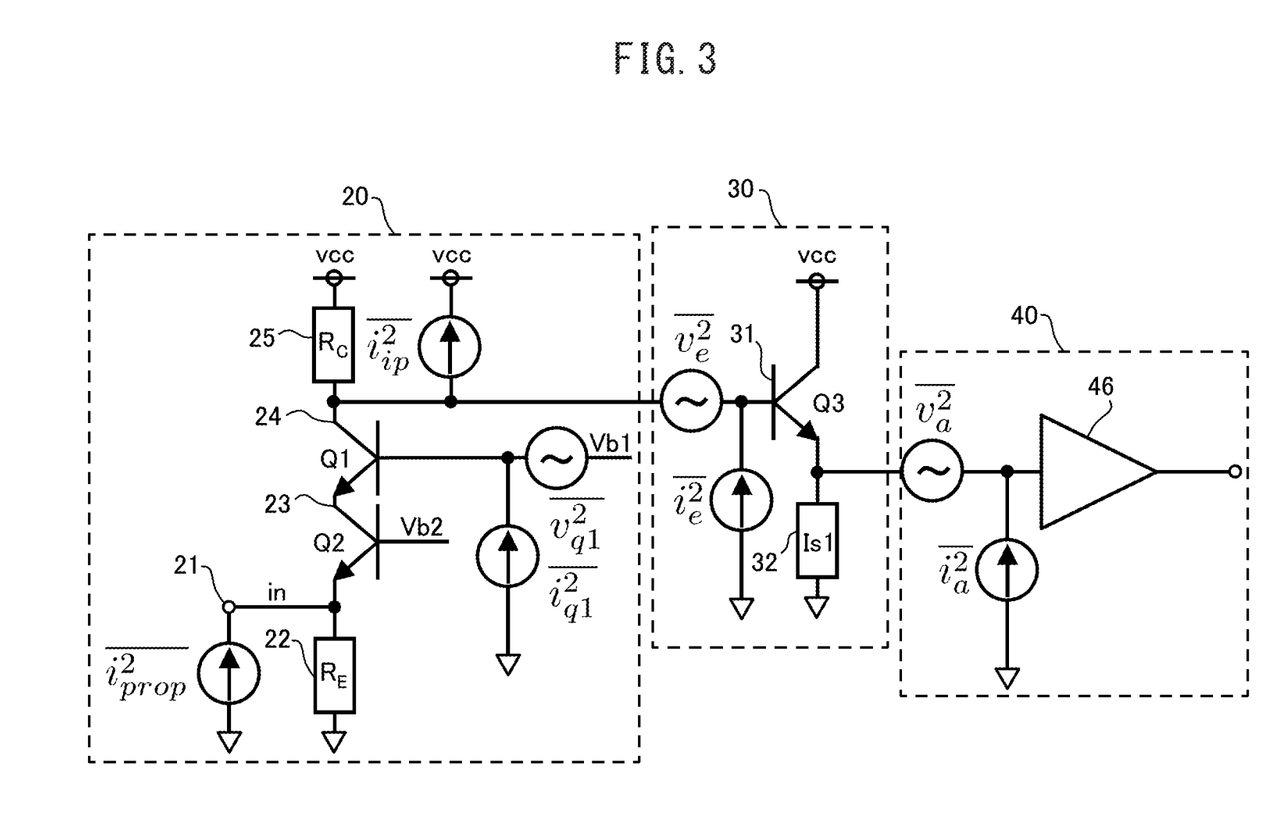
FIG. 3 is a circuit diagram including input referred noise currents and input referred noise voltages of the first common base unit, the first emitter follower unit, and the first amplification unit illustrated in FIG. 2.

FIG. 3 is a circuit diagram including input referred noise currents and input referred noise voltages of the first common base unit 20, the first emitter follower unit 30, and the first amplification unit 40. The input referred noise current and the input referred noise voltage are obtained by carrying out equivalent conversions on the assumption that the noise of each of the first common base unit 20, the first emitter follower unit 30, and the first amplification unit 40 occurs on the input side of each circuit. In FIG. 3, an amplification mechanism unit 46 includes the fourth transistor 41, the fifth transistor 42, the second current source 43, the first connection resistance element 44, and the third resistance element 45. In FIG. 3, $\sqrt{(i^2_{prop})}$ is the total input referred noise current of the first common base unit 20, the first emitter follower unit 30, and the first amplification unit 40, and $\sqrt{(i^2_{ip})}$ is the total input referred noise current of the first emitter follower unit 30 and the first amplification unit 40. Further, $\sqrt{(i^2_{q1})}$ is the input referred noise current of the second transistor 24 and $\sqrt{(v^2_{q1})}$ is the input referred noise voltage of the second transistor 24. Further, $\sqrt{(i^2_e)}$ is the input referred noise current of the first emitter follower unit 30 and $\sqrt{(v^2_e)}$ is the input referred noise voltage of the first emitter follower unit 30. Further, $\sqrt{(i^2_a)}$ is the input referred noise current of the first amplification unit 40 and $\sqrt{(v^2_a)}$ is the input referred noise voltage of the first amplification unit 40.

The total input referred noise current $\sqrt{(i^2_{prop})}$ of the first common base unit 20, the first emitter follower unit 30, and the first amplification unit 40 is expressed by $$\overline{i_{prop}^2} = \overline{i_{bp}^2} + \overline{i_{ip}^2} \quad (1)$$

$\sqrt{(i^2_{bp})}$ is the total input referred noise current of the first resistance element 22, the first transistor 23, and the second resistance element 25 of the first common base unit 20 and $\sqrt{(i^2_{ip})}$ is the total input referred noise current of the first emitter follower unit 30 and the first amplification unit 40. $\sqrt{(i^2_{bp})}$ does not include the input referred noise current $\sqrt{(i^2_{q1})}$ and the input referred noise voltage $\sqrt{(v^2_{q1})}$ of the second transistor 24 is that the input referred noise of the second transistor 24 may be ignored for the following reason.

Figure 4A:
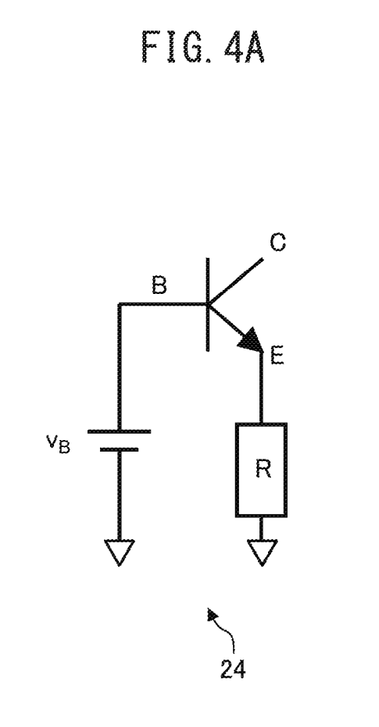
FIG. 4A is a diagram illustrating the second transistor illustrated in FIG. 2.
Figure 4B:
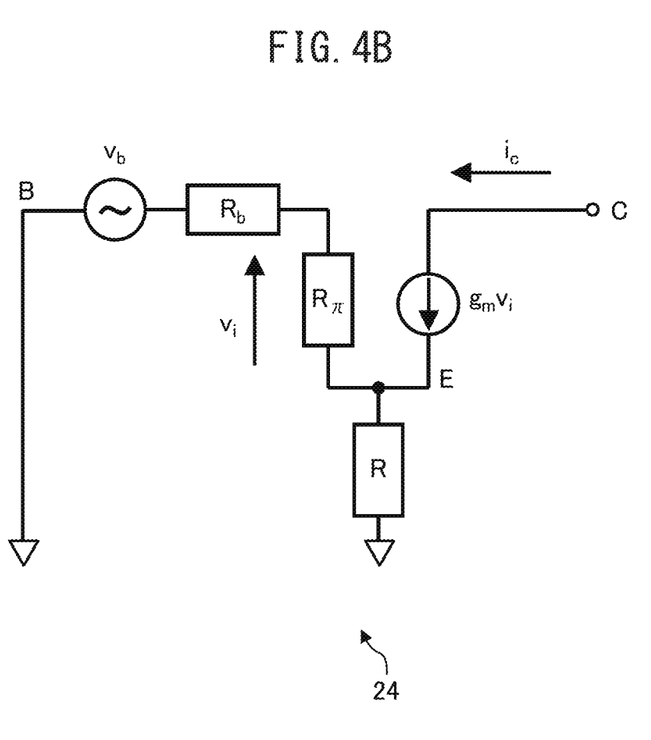
FIG. 4B is a small signal equivalent circuit of the second transistor illustrated in FIG. 4A.

FIG. 4A is a diagram illustrating the second transistor 24 and FIG. 4B is a small signal equivalent circuit of the second transistor 24. In FIG. 4A, $V_B$ is the base voltage and R is the impedance of the collector of the first transistor 23. In FIG.

4B, $v_b$ is the base resistance noise including both the input referred noise current /($i^2_{q1}$) and the input referred noise voltage /($v^2_{q1}$). $R_b$ is the base resistance of the first transistor 23, $R_\pi$ is the resistance for modeling, R is the impedance of the collector of the first transistor 23, and $g_m$ is a constant. The base resistance $R_b$ of the first transistor 23 is about several ten Ω to several hundred Ω, the resistance $R_\pi$ for modeling is about several thousand Ω, and the impedance R of the collector of the first transistor 23 is about several hundred Ω. A current amplification factor $h_{fe}$ that is expressed by a ratio between a collector current $i_c$ and a base current $i_b$ is about several hundreds. From FIG. 4B, the base resistance noise $v_b$ is obtained as follows.

$$v_i = \frac{R_\pi v_b}{R_b + R_\pi + (1 + h_{fe})R} \quad (2)$$

Since $(1+h_{fe})$ R in expression (2) is sufficiently larger than the resistance value $R_\pi$ for modeling, the base resistance noise $v_b$ including both the input referred noise current /($i^2_{q1}$) and the input referred noise voltage /($v^2_{q1}$) may be ignored.

Next, in order to calculate the total input referred noise current /($i^2_{ip}$) of the first emitter follower unit 30 and the first amplification unit 40, the input referred noise current /($i^2_a$) and the input referred noise voltage /($v^2_a$) of the first amplification unit 40 are converted into the input referred noise of the first emitter follower unit 30. In general, in the emitter follower circuit, the voltage amplification factor is about 1, and therefore the input referred noise voltage /($v^2_a$) of the first amplification unit 40 may be converted into the input referred noise of the first emitter follower unit 30 without changing the value. On the other hand, in the emitter follower circuit, the output impedance is very low, and therefore The input referred noise current /($i^2_a$) of the first amplification unit 40 may be ignored, since the input referred noise current /($i^2_a$) of the first amplification unit 40 is very small compared to the output current of the emitter follower circuit. Thus, the total input referred noise current /($i^2_{ip}$) of the first emitter follower unit 30 and the first amplification unit 40 is expressed as follows.

$$\overline{i_{ip}^2} = \frac{\overline{v_a^2} + \overline{v_e^2}}{R_C^2} + \overline{i_e^2} \quad (3)$$

$R_c$ is the resistance value of the second resistance element 25. The noise current is discussed, and therefore the input referred noise current /($i^2_e$) of the first emitter follower unit 30 is the alternating-current component and is converted into the input referred noise voltage by dividing the input referred noise current /($i^2_e$) by the resistance value $R_c$ of the second resistance element 25.

Figure 5:
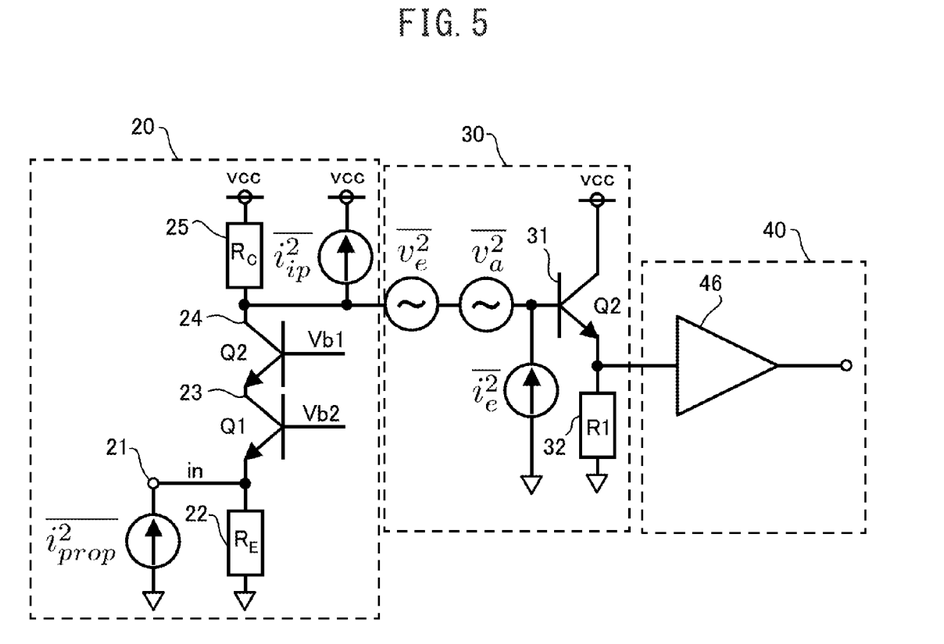
FIG. 5 is a circuit diagram of a circuit equivalent to the circuit in FIG. 3, when the input referred noise of the first amplification unit are converted into the input referred noise of the first emitter follower unit.

FIG. 5 is a circuit diagram including the input referred noise current and the input referred noise voltage when the input referred noise current /($i^2_a$) and the input referred noise voltage /($v^2_a$) of the first amplification unit 40 are converted into the input referred noise of the first emitter follower unit 30. The total input referred noise current /($i^2_{prop}$) is expressed as follows.

$$\overline{i_{prop}^2} = \overline{i_{bp}^2} + \frac{\overline{v_a^2} + \overline{v_e^2}}{R_C^2} + \overline{i_e^2} \quad (4)$$

(Noise Characteristics of Amplifier Related to Amplifier According to Embodiment)

Figure 6:
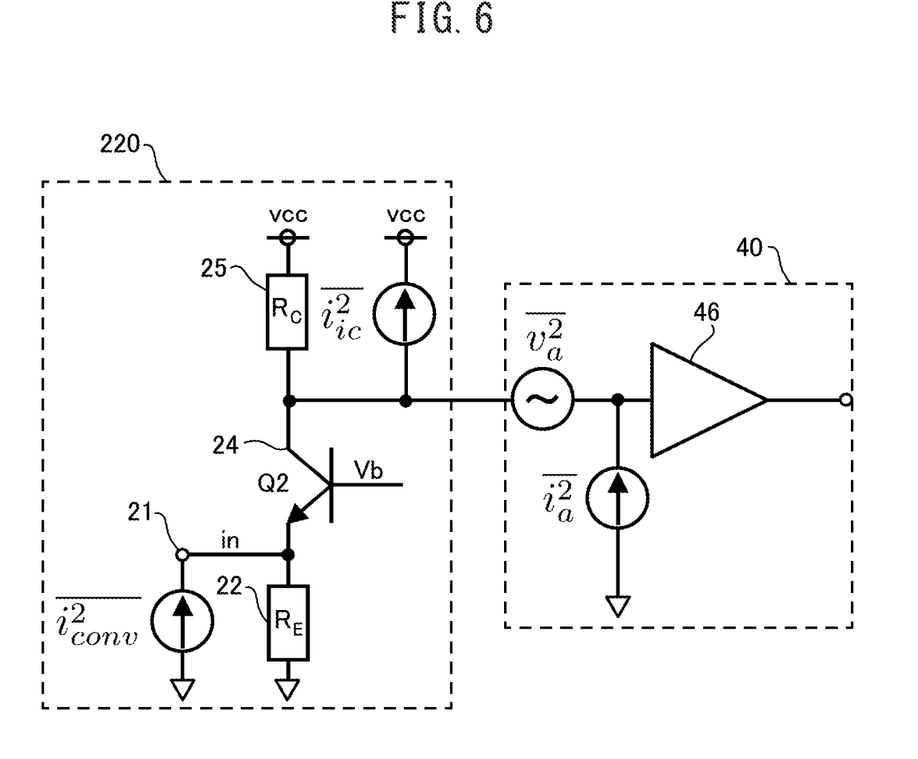
FIG. 6 is a circuit diagram including the input referred noise current and the input referred noise voltage of a related amplification.

FIG. 6 is a circuit diagram including the input referred noise current and the input referred noise voltage when the first transistor 23 of the first common base unit 20 is not arranged and the first emitter follower unit 30 is not arranged between the first common base unit 20 and the first amplification unit 40. In other words, in a common base unit 220 in FIG. 6, the first transistor 23 cascade-connected with the second transistor 24 is not arranged and the first emitter follower unit 30 is not arranged between the common base unit 220 and the first amplification unit 40.

A total input referred noise current /($i^2_{conv}$) of the common base unit 220 and the first amplification unit 40 illustrated in FIG. 6 is expressed as follows.

$$\overline{i_{conv}^2} = \overline{i_{bc}^2} + \overline{i_{ic}^2} \quad (5)$$

/($i^2_{bc}$) is the total input referred noise current of the first resistance element 22, the second transistor 24, and the second resistance element 25 and /($i^2_{ic}$) is the output referred noise current of the common base unit 220. The output referred noise current /($i^2_{ic}$) of the common base unit 220 is expressed as follows.

$$\overline{i_{ic}^2} = \frac{\overline{v_a^2}}{R_C^2} + \overline{i_a^2} \quad (6)$$

From expressions (5) and (6), the total input referred noise current /($i^2_{conv}$) is obtained as follows.

$$\overline{i_{conv}^2} = \overline{i_{bc}^2} + \frac{\overline{v_a^2}}{R_C^2} + \overline{i_a^2} \quad (7)$$

(Comparison of Noise Characteristics Between Amplifier According to Embodiment and Amplifier Illustrated in FIG. 6)

The noise characteristics of the amplifier according to the embodiment illustrated in FIG. 3 and those of the amplifier illustrated in FIG. 6 are compared. In expression (4) expressing the noise characteristics of the amplifier according to the embodiment illustrated in FIG. 3 and in expression (7) expressing the noise characteristics of the amplifier illustrated in FIG. 6, the term including the resistance value $R_c$ of the second resistance element 25 as a denominator may be ignored, and therefore expressions (4) and (7) are approximated as expressions (8) and (9), respectively.

$$\overline{i_{prop}^2} \approx \overline{i_{bp}^2} + \overline{i_e^2} \quad (8)$$

$$\overline{i_{conv}^2} \approx \overline{i_{bc}^2} + \overline{i_a^2} \quad (9)$$

First, the first term on the right side of each of expressions (8) and (9) is discussed. The first term /($i^2_{bp}$) on the right side in expression (8) is the total input referred noise current of the first resistance element 22, the first transistor 23, and the second resistance element 25 of the first common base unit 20. On the other hand, the first term /($i^2_{bc}$) on the right side in expression (9) is the total input referred noise current of the first resistance element 22, the second transistor 24, and the second resistance element 25 of the first common base unit 220. The transistor size of the first transistor 23 is larger than the transistor size of the second transistor 24, and therefore the base resistance of the first transistor 23 is lower than the base resistance of the second transistor 24. A base resistance noise $/(v^2_b)$ is expressed as follows.

$$v_b^2 = 4k_B T R \Delta f \quad (10)$$

$k_B$ is the Boltzmann constant, T is temperature, R is the base resistance, and $\Delta f$ is the band. Since the base resistance of the first transistor 23 is lower than the base resistance of the second transistor 24, the base resistance noise of the first transistor 23 is lower than the base resistance noise of the second transistor 24. Thus, the first term $/(i^2_{bp})$ on the right side in expression (8) including the input referred noise current of the base resistance noise of the first transistor 23 is smaller than the first term $/(i^2_{bc})$ on the right side in expression (9) including the input referred noise current of the base resistance noise of the first transistor 23.

Next, the second term on the right side in each of expressions (8) and (9) is discussed. The second term $/(i^2_e)$ on the right side in expression (8) is the input referred noise current of the first emitter follower unit 30. On the other hand, the second term $/(i^2_a)$ on the right side in expression (9) is the input referred noise current of the first amplification unit 40 including a common emitter circuit. If the transistor size is the same, the input referred noise current of the emitter follower circuit is smaller than the input referred noise current of the common emitter circuit. Thus, the second term $/(i^2_e)$ on the right side in expression (8) including the input referred noise current of the first emitter follower unit 30 is smaller than the second term $/(i^2_a)$ on the right side in expression (9) including the input referred noise current of the first amplification unit 40 including the common emitter circuit.

The first term $/(i^2_{bp})$ on the right side in expression (8) is smaller than the first term $/(i^2_{bc})$ on the right side in expression (9) and the second term $/(i^2_e)$ on the right side in expression (8) is smaller than the second term $/(i^2_a)$ on the right side in expression (9), and therefore the left side in expression (8) is smaller than the left side in expression (9).

(Comparison of Frequency Characteristics Between Amplifier According to Embodiment and Amplifier Illustrated in FIG. 6)

Figure 7A:
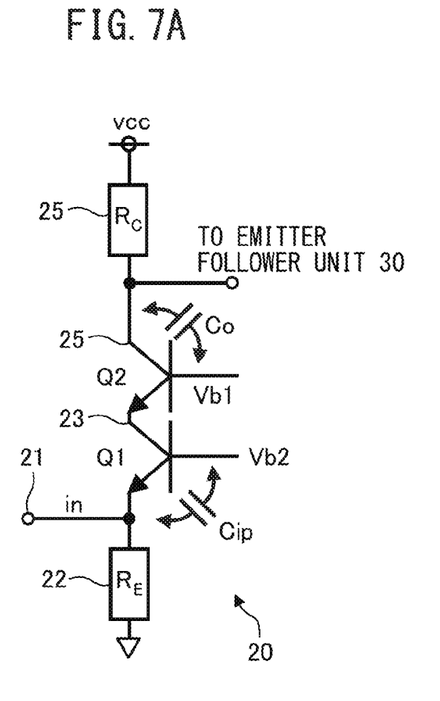
FIG. 7A is a diagram illustrating the parasitic capacitance of a common base unit of the amplifier in FIG. 3.
Figure 7B:
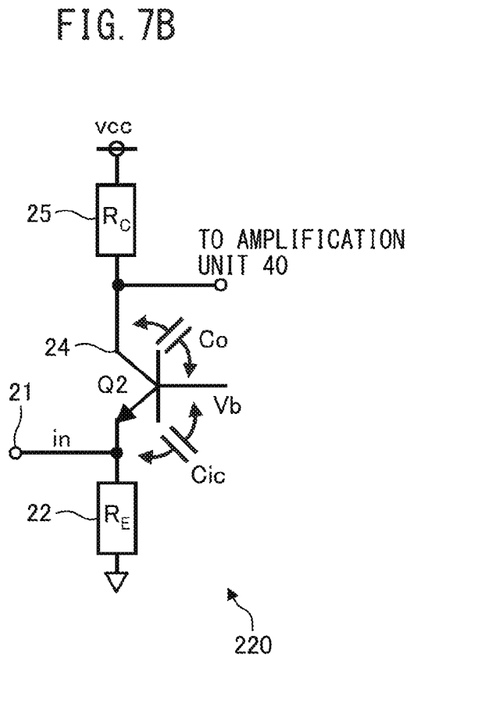
FIG. 7B is a diagram illustrating the parasitic capacitance of a common base unit of the amplifier illustrated in FIG. 6.

FIG. 7A is a diagram illustrating the parasitic capacitance of the first common base unit 20 of the amplifier 12 and FIG. 7B is a diagram illustrating the parasitic capacitance of the common base unit 220 of the amplifier illustrated in FIG. 6.

A cutoff frequency $f_c$ of the first common base unit 20 of the amplifier 12 and the common base unit 220 illustrated in FIG. 6 is obtained as follows from a collector capacitance $C_{op}$ of the second transistor 24 and the resistance value $R_c$ of the second resistance element 25, $$f_c = \frac{1}{2\pi C_O R_C} \quad (11)$$

and therefore in the amplifier 12, the cutoff frequency $f_c$ equivalent to that in the circuit in which only the second transistor 24 is a common base transistor may be obtained, even if the two transistors, i.e., the first transistor 23 and the second transistor 24 whose bases are grounded, are cascade-connected.

On the other hand, the transistor size of the first transistor 23 is larger than the transistor size of the second transistor 24, and therefore a capacitance $C_{ip}$ of the first transistor 23 is larger than a capacitance $C_{ic}$ of the second transistor 24. However, the input electrostatic parasitic capacitance at the input terminal to which the photoelectric conversion element 11 is connected consists dominantly of the capacitance of the photoelectric conversion element 11, the ESD capacitance, and the wire capacitance although the input electrostatic parasitic capacitance is the sum of the capacitance of the photoelectric conversion element 11, the ESD capacitance, the wire capacitance, and the capacitance of the common base transistor. Thus, despite the transistor size of the first transistor 23 and the second transistor 24, the input electrostatic parasitic capacitance of the first common base unit 20 and the input electrostatic parasitic capacitance of the common base unit 220 illustrated in FIG. 6 are almost the same.

(Working-Effect of Amplifier According to Embodiment)

In the amplifier 12, noise resulting from the base resistance may be reduce, and the cutoff frequency may be maintained, since two common base transistors are cascade-connected to the first input terminal 21 to which a current signal is input from the photoelectric conversion element 11. When the two common base transistors are cascade-connected, a voltage less than desired voltage may be supplied to the amplification unit, since the collector voltage of the transistor in the higher stage increases, which supplies a voltage to the amplification unit. Thus, in the amplifier 12, the voltage that is supplied to the amplification unit is adjusted by arranging the first emitter follower unit 30 between the first common base unit 20 and the first amplification unit 40. Further, since the first emitter follower unit 30 is arranged between the first common base unit 20 and the first amplification unit 40, the noise level of the first input terminal 21 to which a current signal is input from the photoelectric conversion element 11 may be further reduced. Since the output impedance of the emitter follower circuit is very low, the input referred noise current of the first amplification unit 40 may be reduced to a level at which the current does not appear at the first input terminal 21. Further, the input referred noise current of the emitter follower circuit is smaller than the input referred noise current of a common emitter amplifier or the like, and therefore the noise level of the first input terminal 21 may be further reduced.

The base resistance of a transistor may be calculated from the conductivity of the material forming the base, and the area and thickness of the base.

Further, in the amplifier 12, a feedback circuit is formed between the first output terminal 54 and the input of the first emitter follower unit 30 by the first feedback resistance element 53, and therefore the noise level of the first input terminal 21 may be further reduced. The first feedback resistance element 53 is connected to the collector of the second transistor 24 in parallel to the second resistance element 25. Since the first feedback resistance element 53 is connected in parallel to the second resistance element 25, the resistance value of the second resistance element 25 may be larger than that of a the second resistance element 25 without the first feedback resistance element 53. Since the resistance value of the second resistance element 25 may be larger, the noise resulting from the second resistance element 25 becomes lower and the noise level of the first input terminal 21 is further reduced.

The first amplification unit 40 and the second amplification unit 80 of the amplifier 12 have the cascode-connected emitter-based circuit, and therefore gain may be increased by increasing the output impedance.

Further, in the amplifier 12, a current signal is input to the first input terminal 21 from the photoelectric conversion element 11, and a differential amplifier is formed, to which a current signal obtained by averaging the current signals that are input to the second input terminal 61 from the photoelectric conversion element 11 is input, and therefore light receiving characteristics may be improved.

(Amplifier According to Another Embodiment)

The amplifier 12 is formed by bipolar transistors, however an amplifier according to another embodiment may be formed by MOS transistors.

Figure 8:
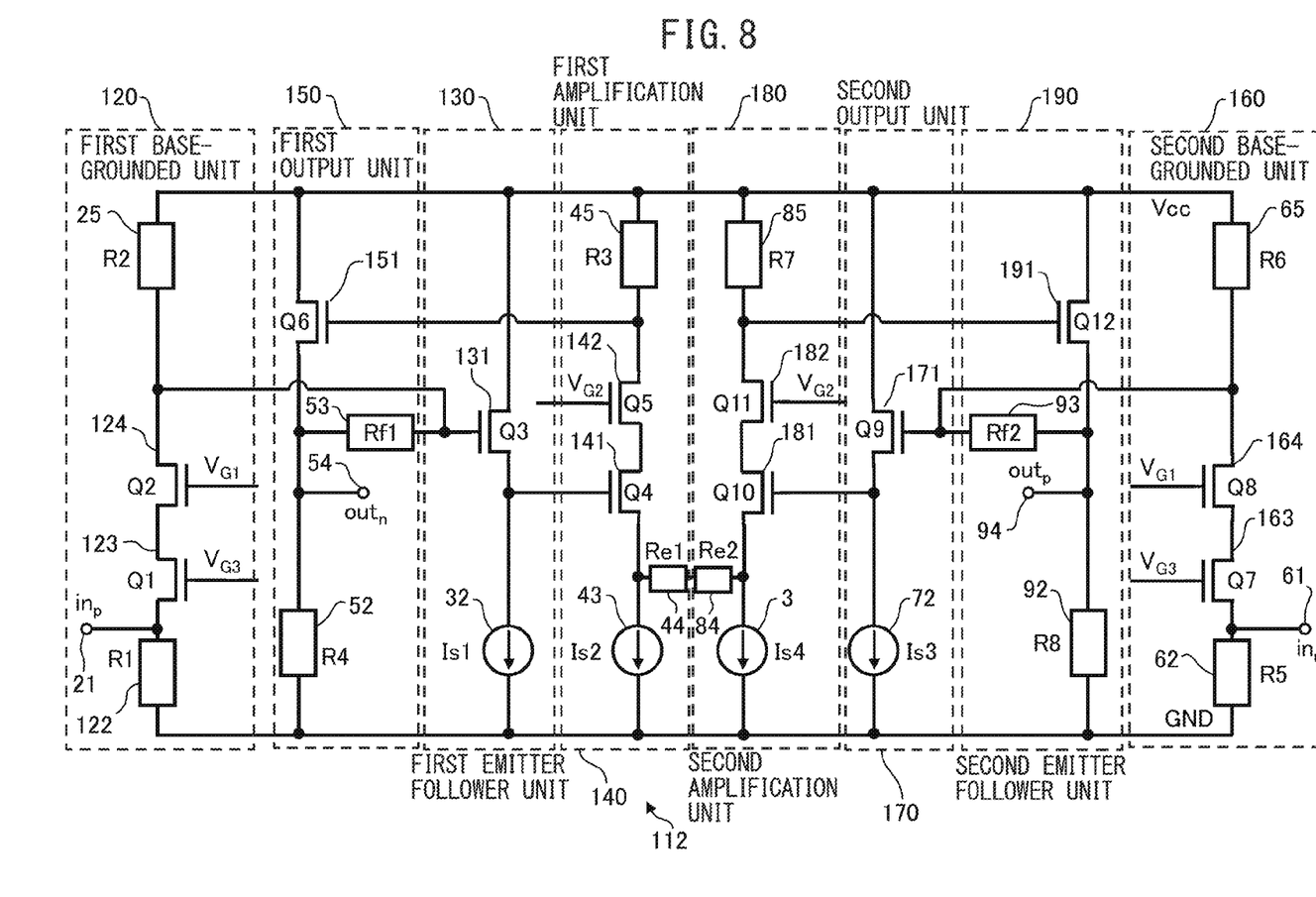
FIG. 8 is a diagram illustrating an amplifier according to other embodiment.

FIG. 8 is a diagram illustrating an amplifier formed by MOS transistors.

An amplifier 112 has a first common base unit 120, a first emitter follower unit 130, a first amplification unit 140, a first output unit 150, a second common base unit 160, a second emitter follower unit 170, a second amplification unit 180, and a second output unit 190. Each circuit of the amplifier 112 differs from the corresponding circuit of the amplifier 12 in having the MOS transistor in place of the bipolar transistor. The configuration and function of each circuit of the amplifier 112 are the same as the configuration and function of the corresponding circuit of the amplifier 12 except in having the MOS transistor, and therefore detailed explanation is omitted.

All examples and conditional language provided herein are intended for pedagogical purposes of aiding the reader in understanding the invention and the concepts contributed by the inventor to furthering the art, and are to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier comprising:
a first transistor which is a common base transistor and whose emitter current fluctuates in accordance with fluctuations in an input current that is input to the emitter;
a second transistor which is a common base transistor, whose emitter is connected to the collector of the first transistor, and whose collector voltage fluctuates in accordance with fluctuations in the emitter current of the first transistor;
a third transistor which is a common collector transistor and whose base is connected to the collector of the second transistor; and
an amplification unit to which an emitter voltage of the third transistor is input and which outputs an amplified voltage obtained by amplifying the emitter voltage of the third transistor, wherein
the base resistance of the second transistor is higher than the base resistance of the first transistor.

2. The amplifier according to claim 1, wherein
the transistor size of the second transistor is smaller than the transistor size of the first transistor.

3. The amplifier according to claim 1, further comprising an output unit to which the amplified voltage is input from the amplification unit and which outputs an output voltage that fluctuates in accordance with fluctuations in the amplified voltage from an output terminal, wherein
the output unit has a feedback resistance element arranged between the output terminal and the base of the third transistor.

4. An amplifier comprising:
a first transistor which is a common gate transistor and whose drain current fluctuates in accordance with an input current that is input to the drain;
a second transistor which is a common gate transistor, whose drain is connected to the source of the first transistor, and whose source voltage fluctuates in accordance with fluctuations in the drain current of the first transistor;
a third transistor which is a common source transistor and whose gate is connected to the source of the second transistor; and
an amplification unit to which a drain voltage of the third transistor is input and which outputs an amplified voltage obtained by amplifying the drain voltage of the third transistor, wherein
the gate resistance of the second transistor is higher than the gate resistance of the first transistor.

5. The amplifier according to claim 4, wherein
the transistor size of the second transistor is smaller than the transistor size of the first transistor.

6. The amplifier according to claim 4, further comprising an output unit to which the amplified voltage is input from the amplification unit and which outputs an output voltage that fluctuates in accordance with fluctuations in the amplified voltage from an output terminal, wherein
the output unit has a feedback resistance element arranged between the output terminal and the gate of the third transistor.

* * * * *